United States Patent
Yoon et al.

(10) Patent No.: US 12,387,798 B2
(45) Date of Patent: Aug. 12, 2025

(54) NONVOLATILE MEMORY DEVICE PROVIDING INPUT/OUTPUT COMPATIBILITY AND METHOD FOR SETTING COMPATIBILITY THEREOF

(71) Applicant: Samsung Electronics Co., Ltd., Suwon-si (KR)

(72) Inventors: Hojun Yoon, Suwon-si (KR); Seungjin Park, Suwon-si (KR); Doobock Lee, Suwon-si (KR); Seunghoon Lee, Suwon-si (KR); Baek Jin Lim, Suwon-si (KR); Youngdon Choi, Suwon-si (KR); Junghwan Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 272 days.

(21) Appl. No.: 18/148,579

(22) Filed: Dec. 30, 2022

(65) Prior Publication Data

US 2024/0046999 A1 Feb. 8, 2024

(30) Foreign Application Priority Data

Aug. 8, 2022 (KR) ........................ 10-2022-0098847

(51) Int. Cl.
*G11C 11/34* (2006.01)
*G06F 1/10* (2006.01)
*G11C 16/04* (2006.01)
*G11C 16/32* (2006.01)

(52) U.S. Cl.
CPC ............. *G11C 16/32* (2013.01); *G06F 1/10* (2013.01); *G11C 16/0483* (2013.01)

(58) Field of Classification Search
CPC .................... G11C 16/32; G11C 16/0483
USPC ..................................... 365/185.18
See application file for complete search history.

(56) References Cited

U.S. PATENT DOCUMENTS

| | | | |
|---|---|---|---|
| 9,014,252 B2 | 4/2015 | Dong et al. | |
| 9,218,575 B2 * | 12/2015 | Mozak | G11C 7/1093 |
| 9,786,353 B2 * | 10/2017 | Mansuri | G11C 7/222 |
| 9,984,740 B1 * | 5/2018 | Hiraishi | G11C 7/222 |
| 10,324,490 B2 | 6/2019 | Mozak | |
| 11,091,031 B2 * | 8/2021 | Sugawara | B60K 23/0808 |
| 11,145,343 B1 * | 10/2021 | Subramanian | G11C 7/109 |

(Continued)

FOREIGN PATENT DOCUMENTS

| | | |
|---|---|---|
| KR | 101948224 B1 | 2/2019 |
| KR | 20220026432 A | 3/2022 |
| KR | 20220058970 A | 5/2022 |

*Primary Examiner* — Viet Q Nguyen
(74) *Attorney, Agent, or Firm* — Myers Bigel, P.A.

(57) ABSTRACT

A nonvolatile memory device may include a variable sampler configured to process a data signal in an amplifier mode or a sampler mode in response to a control signal, a selection circuit configured to transmit the data signal output from the variable sampler to a flip-flop via a delay unit or to the flip-flop via a path that bypasses the delay unit in response to the control signal, a converter configured to amplify a data strobe signal, a clock distribution network configured to transmit the data strobe signal amplified by the converter to the variable sampler or delay the amplified data strobe signal for a predetermined time and transmit the amplified data strobe signal to the flip-flop in response to the control signal, and a path controller configured to generate the control signal according to an input/output mode.

20 Claims, 11 Drawing Sheets

(56) References Cited

U.S. PATENT DOCUMENTS

| | | | |
|---|---|---|---|
| 11,188,264 B2* | 11/2021 | Qawami | G06F 3/0659 |
| 11,223,328 B2 | 1/2022 | Wu et al. | |
| 11,550,498 B2* | 1/2023 | Kim | G06F 3/0604 |
| 11,670,387 B2* | 6/2023 | Seo | G11C 16/3481 |
| | | | 365/185.22 |
| 12,068,051 B2* | 8/2024 | Choi | G11C 29/56012 |
| 2021/0233579 A1* | 7/2021 | Aquil | G06F 13/4243 |
| 2021/0313945 A1 | 10/2021 | Hong et al. | |
| 2022/0066689 A1 | 3/2022 | Jung et al. | |
| 2022/0358061 A1* | 11/2022 | Siliveri | G06F 13/1673 |
| 2023/0123826 A1* | 4/2023 | Magee | H03K 19/1774 |
| | | | 365/233.1 |
| 2023/0386584 A1* | 11/2023 | Ramachandra | G11C 7/222 |
| 2024/0055042 A1* | 2/2024 | Low | G11C 29/023 |
| 2024/0112720 A1* | 4/2024 | Willey | G11C 11/4076 |
| 2024/0230725 A9* | 7/2024 | Low | G01R 19/10 |
| 2024/0312551 A1* | 9/2024 | Kavala | G11C 29/38 |

* cited by examiner

NONVOLATILE MEMORY DEVICE PROVIDING INPUT/OUTPUT COMPATIBILITY AND METHOD FOR SETTING COMPATIBILITY THEREOF

CROSS-REFERENCE TO RELATED APPLICATIONS

This application claims priority under 35 U.S.C. § 119 to Korean Patent Application No. 10-2022-0098847 filed on Aug. 8, 2022, in the Korean Intellectual Property Office, the disclosures of which are incorporated by reference herein in their entireties.

BACKGROUND

Embodiments of the present disclosure described herein relates to a semiconductor memory device, and more particularly, to a nonvolatile memory device providing input/output compatibility and a method for setting compatibility thereof.

In recent years, various mobile devices or electronic devices such as smart phones, desktop computers, laptop computers, tablet PCs, and wearable devices have been widely used. These electronic devices usually include a storage device for storing data. In particular, in accordance with the trend of increasing the capacity and speed of the electronic devices, many efforts have been made to increase the capacity and speed of the storage device.

A flash memory device, which is a nonvolatile memory, is used as storage in various fields from mobile devices to computer systems. With the development of technology and the demand for performance improvement, the data input/output speed of the flash memory device is rapidly increasing. In particular, the vertically stacked NAND flash memory (V-NAND Flash Memory) has a tendency to rapidly increase the input/output speed as the generation progresses.

The input/output circuit in charge of input/output of the NAND flash memory has applied a matched type structure in which delays of the data signal DQ and the strobe signal DQS are preset. However, as the input/output speed increases, the input/output circuit can be required to adopt an unmatched type structure suitable for high-speed input/output. Alignment of the data signal DQ and the strobe signal DQS in the unmatched input/output circuit can be achieved through training performed during booting sequence.

When the unmatched input/output circuit is used, the data signal DQ may reach the sampler (or latch) through the shortest path. Accordingly, it is possible to minimize jitter of the data signal DQ through the unmatched input/output circuit and apply filters capable of immediately compensating for inter-symbol interference ISI. Therefore, the unmatched input/output circuit is suitable for high-speed input/output operation.

As an input/output speed increases in a flash memory device, an unmatched input/output circuit may be necessary. However, even if the input/output circuit is implemented in an unmatched type suitable for high-speed operation, it may need to be usable by a host or a memory controller using a legacy protocol. The demand for a flash memory device capable of providing such compatibility is rapidly increasing.

SUMMARY

Embodiments of the present disclosure provide a nonvolatile memory device having input/output compatibility and a method for setting compatibility thereof.

According to an embodiment of the inventive concept, a nonvolatile memory device configured to receive a data signal and a data strobe signal from an external source may include a variable sampler configured to process the data signal in an amplifier mode or a sampler mode in response to a control signal, a selection circuit configured to transmit the data signal output from the variable sampler to a flip-flop via a delay unit or to the flip-flop via a path that bypasses the delay unit in response to the control signal, a converter configured to amplify the data strobe signal, a clock distribution network configured to transmit the data strobe signal amplified by the converter to the variable sampler or delay the amplified data strobe signal for a predetermined time and transmit the amplified data strobe signal to the flip-flop in response to the control signal, and a path controller configured to generate the control signal according to an input/output mode.

According to another embodiment of the inventive concept, a nonvolatile memory device may include a compatible input/output circuit configured to align a delay of a data signal and a data strobe signal by setting a path of the data signal and a path of the data strobe signal to either a matched mode or an unmatched mode according to an input/output mode such that a sampled data signal is output from the compatible input/output circuit, and a memory core including memory cells for storing that sampled data signal output from the compatible input/output circuit, wherein, in the unmatched mode, the data signal and the data strobe signal are aligned through a training operation.

According to an embodiment of the inventive concept, a method of setting compatibility of a nonvolatile memory device may include receiving an input/output mode of a data signal and a data strobe signal from a source external to the nonvolatile memory device, setting paths of the data signal and the data strobe signal in an input/output circuit of the nonvolatile memory device to a matched type or an unmatched type according to the received input/output mode, and performing a training operation to align the data signal with the data strobe signal when the input/output circuit is set to the unmatched type.

BRIEF DESCRIPTION OF THE FIGURES

The above and other objects and features of the present disclosure will become apparent by describing in detail embodiments thereof with reference to the accompanying drawings.

DETAILED DESCRIPTION

It is to be understood that both the foregoing general description and the following detailed description are exemplary, and it is to be considered that an additional description of the claimed invention is provided. Reference signs are indicated in detail in preferred embodiments of the present invention, examples of which are indicated in the reference drawings. Wherever possible, the same reference numbers are used in the description and drawings to refer to the same or like parts.

Figure 1:
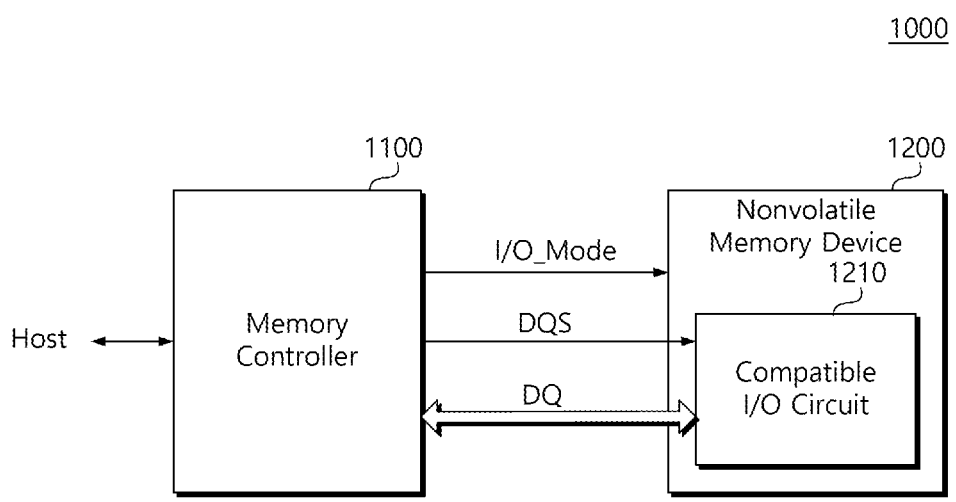
FIG. 1 is a block diagram illustrating a storage device including a nonvolatile memory device according to an embodiment of the present invention.

FIG. 1 is a block diagram illustrating a storage device including a nonvolatile memory device according to an embodiment of the present invention. Referring to FIG. 1, a storage device 1000 according to the present invention may include a memory controller 1100 and a nonvolatile memory device 1200. For example, each of the memory controller 1100 and the nonvolatile memory device 1200 may be provided as one chip, one package, or one module. Alternatively, the memory controller 1100 and the nonvolatile memory device 1200 may be formed as one chip, one package, or one module to be provided as storage such as an embedded memory, a memory card, a memory stick, and a solid state drive SSD.

The memory controller 1100 may perform an access operation for writing data to the nonvolatile memory device 1200 or reading data stored in the nonvolatile memory device 1200. The memory controller 1100 may generate a command CMD and an address ADD for accessing the nonvolatile memory device 1200. In particular, the memory controller 1100 may provide a data signal DQ and a data strobe signal DQS to transmit data, an address, or a command. The data signal DQ and the data strobe signal DQS may need to be precisely matched to ensure data reliability.

The memory controller 1100 may provide an input/output mode I/O_Mode for selecting a reception method of the data signal DQ and the data strobe signal DQS of the nonvolatile memory device 1200. A reception method of the data signal DQ and the data strobe signal DQS of the nonvolatile memory device 1200 may be selected by providing the input/output mode I/O_Mode. If the transmission method of the data signal DQ and the data strobe signal DQS corresponds to the conventional matched type, the compatible input/output circuit 1210 of the nonvolatile memory device 1200 may be set to the matched type. In this case, the memory controller 1100 may set the compatible input/output circuit 1210 of the nonvolatile memory device 1200 to a matched type through the input/output mode I/O_Mode. On the other hand, when the transmission method of the data signal DQ and the data strobe signal DQS corresponds to an unmatched type suitable for high-speed operation, the compatible input/output circuit 1210 of the nonvolatile memory device 1200 may be set to the unmatched type that aligns the data signal DQ and the data strobe signal DQS through training. In this case, the memory controller 1100 may set the compatible input/output circuit 1210 of the nonvolatile memory device 1200 to the unmatched type through the input/output mode I/O_Mode.

The nonvolatile memory device 1200 may output read data requested by the memory controller 1100 to the memory controller 1100 or store data requested to be written by the memory controller 1100 in a memory cell. In particular, the nonvolatile memory device 1200 of the present invention may include the compatible input/output circuit 1210. The compatible input/output circuit 1210 may set the alignment method of the data signal DQ and the data strobe signal DQS to a matched type or an unmatched type according to the input/output mode I/O_Mode. To this end, the compatible input/output circuit 1210 may change the paths of the data signal DQ and the data strobe signal DQS into a matched type or an unmatched type.

Here, the nonvolatile memory device 1200 may include a plurality of memory blocks BLK1 to BLKn-1. Each of the plurality of memory blocks BLK1 to BLKn-1 may have a three-dimensional memory structure in which a word line layer is stacked in a vertical direction on a substrate. Each of the plurality of memory blocks BLK1 to BLKn-1 may be managed by the memory controller 1100 through information for wear leveling, such as an erase count. The nonvolatile memory device 1200 may have a chip to chip (C2C) structure. Here, in the C2C structure, at least one upper chip including a cell region and a lower chip including a peripheral circuit region may be manufactured, respectively, and then the at least one upper chip and the lower chip may be bonded to each other. The advantages of the present invention have been described with reference to a flash memory device, but the present disclosure is not limited thereto.

As described above, according to the configuration and function of the compatible input/output circuit 1210, the nonvolatile memory device 1200 of the present invention may have compatibility with respect to each of the matched interface and the unmatched interface. That is, an arrangement method of the data signal DQ and the data strobe signal DQS of the nonvolatile memory device 1200 may be selected according to the interface type of the memory controller 1100. Through this, it may be freely mounted on an unmatched memory controller requiring high-speed data transfer or an existing matched memory controller.

Figure 2:
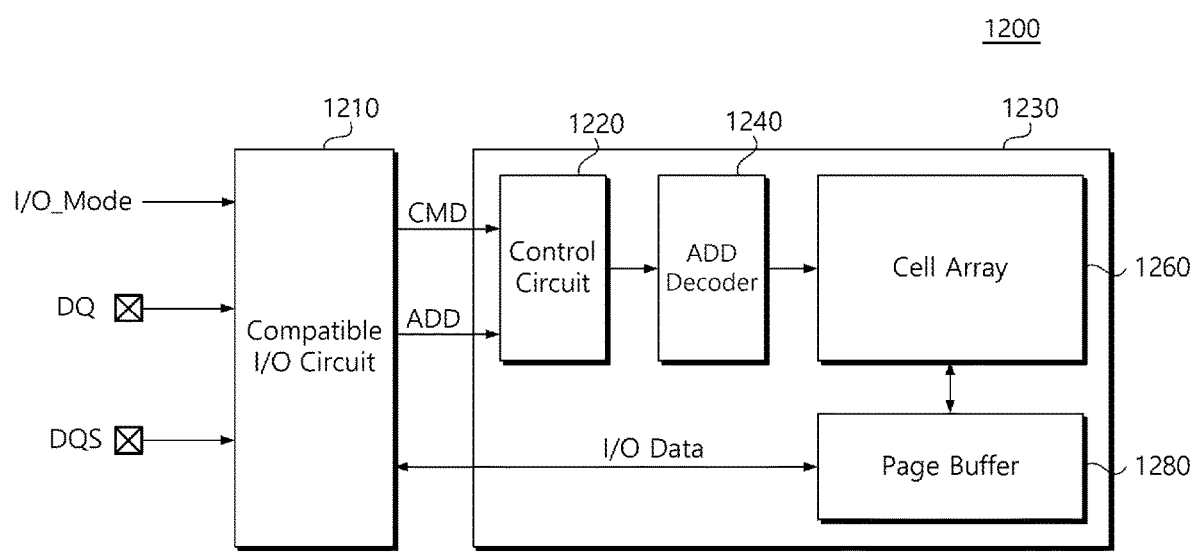
FIG. 2 is a block diagram exemplarily illustrating the configuration of the nonvolatile memory device of FIG. 1.

FIG. 2 is a block diagram exemplarily illustrating the configuration of the nonvolatile memory device of FIG. 1. Referring to FIG. 2, the nonvolatile memory device 1200 may include a compatible input/output circuit 1210 constituting an input/output terminal and a memory core 1230 configured to store and read data.

The compatible input/output circuit 1210 may change the alignment method of the data signal DQ and the data strobe signal DQS of the nonvolatile memory device 1200. The compatible input/output circuit 1210 may set the alignment method of the data signal DQ and the data strobe signal DQS to a matched type or an unmatched type according to the input/output mode I/O_Mode. For example, the compatible input/output circuit 1210 may set the alignment method of the data signal DQ and the data strobe signal DQS according to the input/output mode I/O_Mode provided from the memory controller 1100 at booting sequence. If the input/output mode I/O_Mode corresponds to the matched type, the compatible input/output circuit 1210 may set the preset delay magnitudes of the data signal DQ and the data strobe signal DQS. On the other hand, when the input/output mode I/O_Mode corresponds to the unmatched type, a path that minimizes the path of the data signal DQ may be activated.

In addition, the compatible input/output circuit 1210 may perform training for aligning the data signal DQ and the data strobe signal DQS.

In the unmatched or matched input/output mode (I/O_Mode), when the alignment of the data signal DQ and the data strobe signal DQS is completed, the compatible input/output circuit 1210 may transmit the input/output data I/O Data into the memory core 1230. That is, the compatible input/output circuit 1210 may exchange input/output data with read or write circuits such as the page buffer 1280. In addition, the compatible input/output circuit 1210 may transmit a command CMD or an address ADD provided through the aligned data signal DQ and the data strobe signal DQS to the control circuit 1220.

The memory core 1230 may include a control circuit 1220, an address decoder 1240, a cell array 1260, and the page buffer 1280.

The control circuit 1220 may control the page buffer 1280, the address decoder 1240, and a voltage generator (not shown) in response to a command CMD transmitted from the outside (e.g., transmitted from a source external to the memory core 1230). The control circuit 1220 may control the page buffer 1280 and the address decoder 1240 to perform program, read, and erase operations on the selected memory cell according to the command CMD.

The address decoder 1240 may select any one of the memory blocks of the cell array 1260 in response to the address ADD. The address decoder 1240 may select any one of the word lines of the selected memory block in response to the address ADD. The address decoder 1240 may transfer the voltage corresponding to the operation mode to the word line of the selected memory block. During the program operation, the address decoder 1240 may transfer the program voltage Vpgm and the verify voltage Vfy to the selected word line and a pass voltage to the unselected word line. During a read operation, the address decoder 1240 may transfer the read voltage to the selected word line and the read pass voltage to the unselected word line.

The cell array 1260 may be connected to the address decoder 1240 through word lines WLs or selection lines SSL and GSL. The cell array 1260 may be connected to the page buffer 1280 through bit lines BLs. The cell array 1260 may include a plurality of NAND cell strings. A channel of each of the NAND cell strings may be formed in a vertical or horizontal direction. The cell array 1260 of the present invention may include a plurality of memory cells forming a cell string. The plurality of memory cells may be programmed, erased, and sensed by a voltage applied to the bit line BLs or the word line WLs. The program operation may be performed in unit of page and the erase operation may be performed in unit of block.

As an embodiment of the present invention, the cell array 1260 may be provided as a three-dimensional memory array. A three-dimensional memory array may be formed monolithically on one or more physical levels of an array of memory cells having an active area disposed over a silicon substrate and circuitry associated with operation of the memory cells. The circuitry involved in the operation of the memory cells may be located in or on the substrate. The term monolithic means that the layers of each level of the three-dimensional array may be deposited directly over the layers of the lower level of the three-dimensional array.

In an embodiment of the present invention, the 3D memory array may have vertical directionality, and may include vertical NAND cell strings in which at least one memory cell is positioned on another memory cell. At least one memory cell may include a charge trap layer. Each vertical NAND cell string may include at least one select transistor positioned over memory cells. The at least one selection transistor may have the same structure as the memory cells, and may be monolithically formed together with the memory cells.

A configuration in which a three-dimensional memory array is composed of a plurality of levels, with word lines or bit lines shared between the levels, and suitable for a three-dimensional memory array is disclosed in U.S. Pat. Nos. 7,679,133; 8,553,466; 8,654,587; 8,559,235, and U.S. Patent Publication No. 2011/0233648, which are incorporated herein by reference.

The page buffer 1280 may operate as a write driver or as a sense amplifier. During a program operation, the page buffer 1280 may transfer a bit line voltage corresponding to data to be programmed to the bit lines BLs of the cell array 1260. During a read operation or a verification read operation, the page buffer 1280 may sense data stored in the selected memory cell through the bit lines BLs. The page buffer 1280 may program the input data provided by the compatible input/output circuit 1210 into the cell array 1260. In addition, when a read command is provided, the page buffer 1280 may sense data from the cell array 1260. Data sensed by the page buffer 1280 may be output to the memory controller 1100 (refer to FIG. 1) through the compatible input/output circuit 1210.

As described above, the nonvolatile memory device 1200 of the present invention including the compatible input/output circuit 1210 may change the alignment method of the data signal DQ and the data strobe signal DQS. In particular, when the unmatched alignment method is selected, the compatible input/output circuit 1210 may train the data signal DQ and the data strobe signal DQS for transmitting and receiving high-speed input/output data. Accordingly, the nonvolatile memory device 1200 of the present invention may provide high compatibility regardless of the type of data interface of the memory controller 1100.

Figure 3:
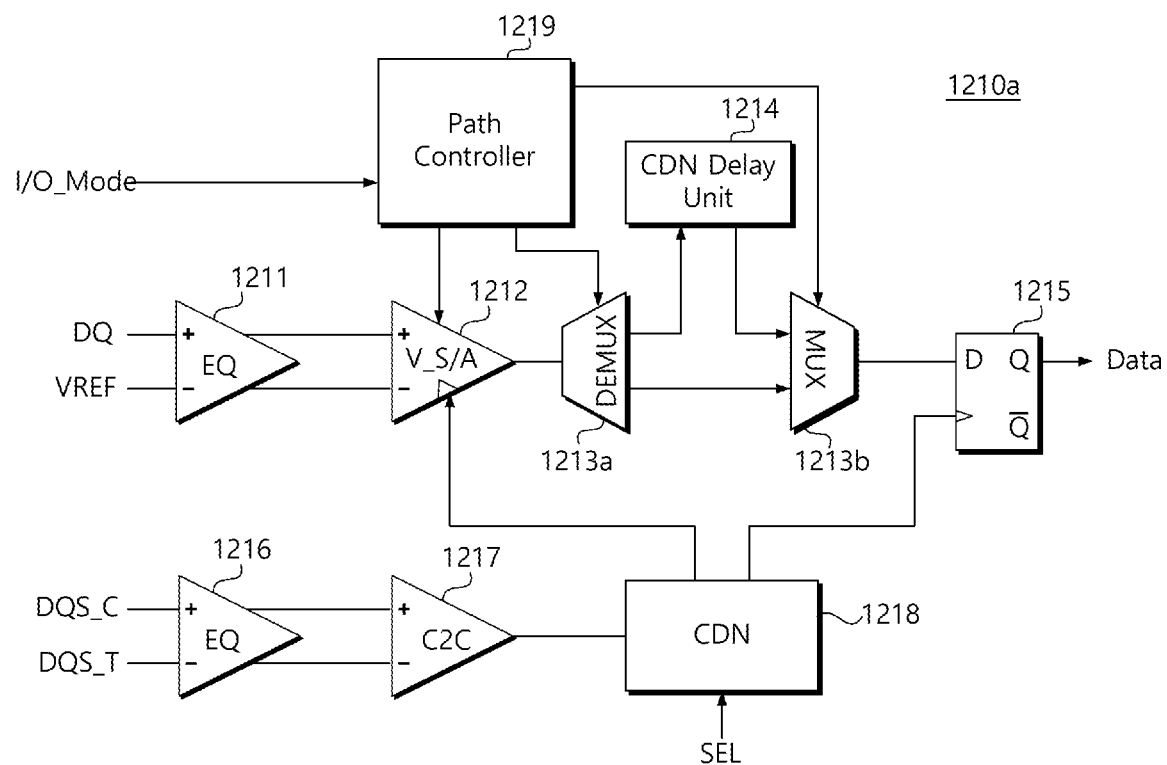
FIG. 3 is a block diagram schematically illustrating an embodiment of the compatible input/output device of FIG. 2.

FIG. 3 is a block diagram schematically illustrating an embodiment of the compatible input/output device of FIG. 2. Referring to FIG. 3, the compatible input/output circuit 1210a according to an embodiment may include equalizers 1211 and 1216, a variable sampler 1212, a demultiplexer 1213a, a multiplexer 1213b, a clock distribution network (CDN) delay unit 1214, a flip-flop 1215, a C2C 1217, a clock distribution network 1218, and a path controller 1219.

Each of the equalizers 1211 and 1216 may filter and output the received data signal DQ and the data strobe signals DQS_C and DQS_T. For example, the equalizers 1211 and 1216 may be configured as a decision feedback equalizer DFE. Equalizers 1211 and 1216 may be configured to remove inter-symbol interference ISI between the received data signal DQ and the data strobe signals DQS_C and DQS_T, and a predetermined coefficient may be applied to a previous symbol, a current symbol, and/or a subsequent symbol.

The variable sampler 1212 may receive the data signal DQ in the sampler mode or the amplifier mode according to the input/output mode I/O_Mode. The variable sampler 1212 may operate in a sampler mode in which the data signal DQ is sampled by the data strobe signal DQS when the input/output mode I/O_Mode corresponds to the unmatched mode. On the other hand, when the input/output mode I/O_Mode corresponds to the matched mode, the variable sampler 1212 may operate in the amplifier mode for amplifying the data signal DQ. That is, in the matched mode, the variable sampler 1212 may perform the same operation as (i.e., by synchronized with) the common mode-CMOS (CML to CMOS: hereinafter, C2C) converter 1217. Accordingly, in the matched mode, sampling of data using the data strobe signal DQS may occur in the flip-flop 1215. Variable sampler 1212 may be configured utilizing a Double Tail Latch or Strong Arm Latch, for example.

The demultiplexer 1213*a* and the multiplexer 1213*b* may delay or transfer the path of the data signal DQ output from the variable sampler 1212 to the flip-flop 1215 without delay according to the input/output mode I/O_Mode. For example, the demultiplexer 1213*a* and the multiplexer 1213*b* may transmit the data signal DQ output from the variable sampler 1212 to the flip-flop 1215 without delay when the input/output mode I/O_Mode corresponds to the unmatched mode. On the other hand, when the input/output mode I/O_Mode corresponds to the matched mode, the demultiplexer 1213*a* and the multiplexer 1213*b* may transmit the data signal DQ via the CDN delay unit 1214 to the flip-flop 1215 which may constitute the output terminal of the compatible input/output circuit 1210*a*.

The CDN delay unit 1214 may equally apply the delay of the data strobe signal DQS generated in the clock distribution network 1218 to the data signal DQ. In particular, the CDN delay unit 1214 may be used to align the delay of the data signal DQ with the data strobe signal DQS in the matched mode in which the variable sampler 1212 operates in an amplifier mode. However, when the input/output mode I/O_Mode corresponds to the unmatched mode, the transferring of the data signal DQ to the CDN delay unit 1214 may not occur.

The flip-flop 1215 may be used as a sampler or a simple data latch according to an input/output mode I/O_Mode. When the input/output mode I/O_Mode corresponds to the unmatched mode, the variable sampler 1212 may operate as a sampler of the data signal DQ. In this case, the flip-flop 1215 may provide only a function of transferring the data signal DQ sampled by the variable sampler 1212 as input/output data. On the other hand, when the input/output mode I/O_Mode corresponds to the matched mode, the variable sampler 1212 may operate in the amplifier mode. Accordingly, the flip-flop 1215 may sample the data signal DQ whose delay is aligned according to the data strobe signal DQS provided from the clock distribution network 1218.

The C2C converter 1217 may convert the common mode signal into a CMOS signal. That is, the C2C converter 1217 may convert the data strobe signals DQS_C and DQS_T swinging in the form of a differential signal into a CMOS signal. Consequently, the C2C converter 1217 may operate as an amplifier for the data strobe signals DQS_C and DQS_T.

The clock distribution network 1218 may delay the data strobe signal DQS by a preset amount of delay. In addition, the clock distribution network 1218 may transmit the data strobe signal DQS to the variable sampler 1212 or the flip-flop 1215 in response to the selection signal SEL provided from the path controller 1219.

The path controller 1219 may select a path through which the data signal DQ and the data strobe signal DQS are transmitted according to the input/output mode I/O_Mode. When the input/output mode I/O_Mode corresponds to the unmatched mode, the path controller 1219 may control the variable sampler 1212 to operate in a sampler mode in which the data signal DQ is sampled by the data strobe signal DQS. In addition, the path controller 1219 may control the demultiplexer 1213*a* and the multiplexer 1213*b* to transfer the data signal DQ output from the variable sampler 1212 to the flip-flop 1215 without delay in the unmatched mode.

On the other hand, when the input/output mode I/O_Mode corresponds to the matched mode, the path controller 1219 may control the variable sampler 1212 to operate in the same amplifier mode as the C2C converter 1217 (i.e., be synchronized with the C2C converter 1217). In addition, the path controller 1219 may control the demultiplexer 1213*a* and the multiplexer 1213*b* so that the data signal DQ output from the variable sampler 1212 is transferred to the flip-flop 1215 via the CDN delay unit 1214 in a matched mode.

In the above, a method of setting the transmission path of the data signal DQ and the data strobe signal DQS of the compatible input/output circuit 1210*a* according to the input/output mode I/O_Mode has been described. In the input/output mode I/O_Mode of the unmatched mode suitable for high-speed data transmission, the data signal DQ may be sampled by the variable sampler 1212, and may be transferred to the memory core 1230 without delay. Thereafter, alignment of the data signal DQ and the data strobe signal DQS may be performed through training. On the other hand, in the input/output mode I/O_Mode of the matched mode, the data signal DQ may be transferred to the flip-flop 1215 via the CDN delay unit 1214. The CDN delay unit 1214 may be a delay unit with a delay matched to the clock distribution network 1218 that is the path of the data strobe signal DQS. Accordingly, compatibility of input/output signals of the nonvolatile memory device 1200 may be ensured through the compatible input/output circuit 1210*a*.

Figure 4:
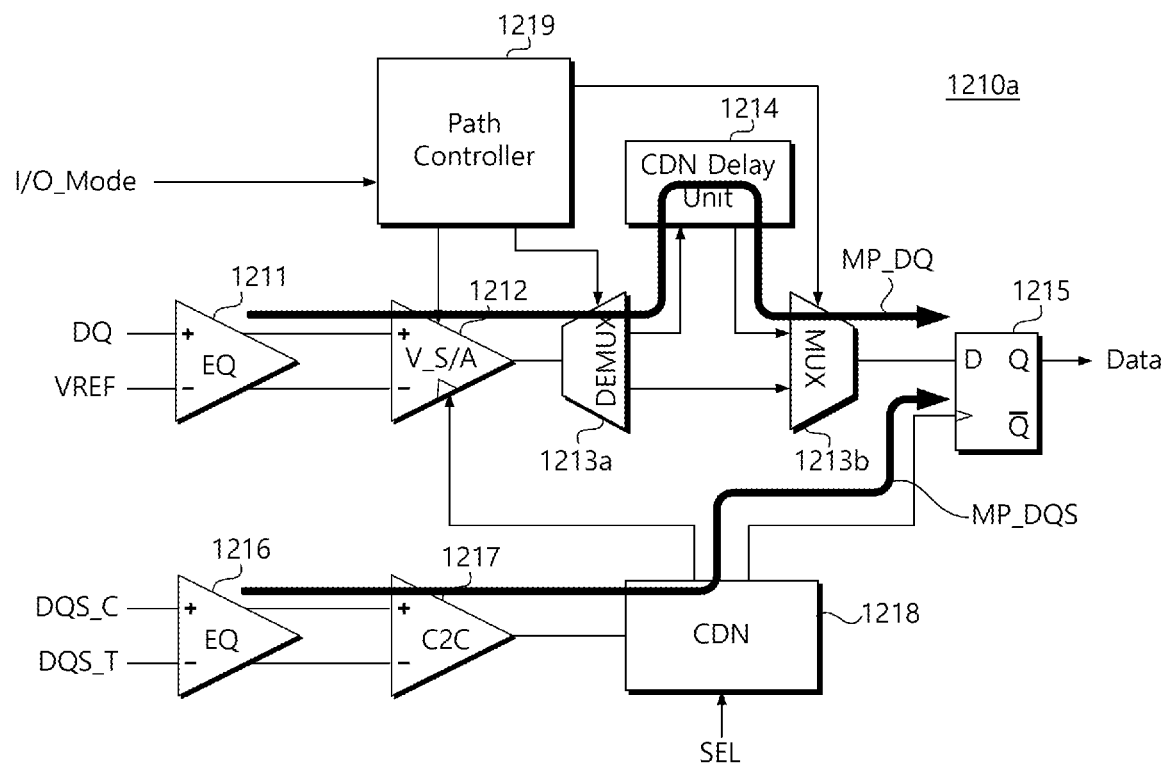
FIG. 4 is a diagram showing paths of a data signal DQ and a data strobe signal DQS in a matched mode of the compatible input/output circuit of the present invention, respectively.

FIG. 4 is a diagram illustrating paths of a data signal DQ and a data strobe signal DQS in a matched mode of the compatible input/output circuit of FIG. 3, respectively. Referring to FIG. 4, according to the path MP_DQ of the data signal DQ in the matched mode, data signal DQ may be transmitted to the flip-flop 1215 via the CDN delay unit 1214 for alignment with the data strobe signal DQS. In addition, the data strobe signal DQS may be transmitted to the flip-flop 1215 with a delay by a predetermined amount through the clock distribution network 1218.

The input/output mode I/O_Mode may be provided as a matched mode from the memory controller 1100. The input/output mode I/O_Mode may be provided from the memory controller 1100 through a command or a control signal. The input/output mode I/O_Mode may be transmitted by using a Universal Internal Bus (UIB) command or by using a special command transmitted by the memory controller 1100, for example, a Get feature or Set feature command.

In the input/output mode I/O_Mode of the matched mode, the data signal DQ transferred to the equalizer 1211 may be transferred to the flip-flop 1215 along the data path MP_DQ. That is, in the matched mode, the variable sampler 1212 may operate as an amplifier for the data signal DQ. The data signal DQ amplified by the variable sampler 1212 may be transferred to the CDN delay unit 1214 by the demultiplexer 1213*a* controlled by the path controller 1219. The data signal DQ output from the CDN delay unit 1214 may be selected by the multiplexer 1213*b* and transmitted to the flip-flop 1215. Path selection operations of the variable sampler 1212, the demultiplexer 1213*a*, and the multiplexer 1213*b* may be controlled by the path controller 1219 according to the input/output mode I/O_Mode.

In the matched mode, the data strobe signal DQS transferred to the equalizer 1216 may be transferred to the clock input terminal of the flip-flop 1215 along the data strobe path MP_DQS. In the matched mode, the data strobe signal DQS may be amplified by the C2C converter 1217. The amplified data strobe signal DQS may be passed to a clock distribution network 1218. The delay magnitude of the clock distribution network 1218 may be provided as a predetermined value for alignment with the data signal DQ. The delay-adjusted data strobe signal DQS in the clock distribution network 1218 may be transmitted to the clock input terminal of the flip-flop 1215. Then, sampling of the data signal DQ in a matched mode may be performed by the flip-flop 1215.

As described above, according to the path selection operation of the compatible input/output circuit 1210*a* in the matched mode, the data signal DQ and the data strobe signal DQS may be matched with a predetermined delay value.

Figure 5:
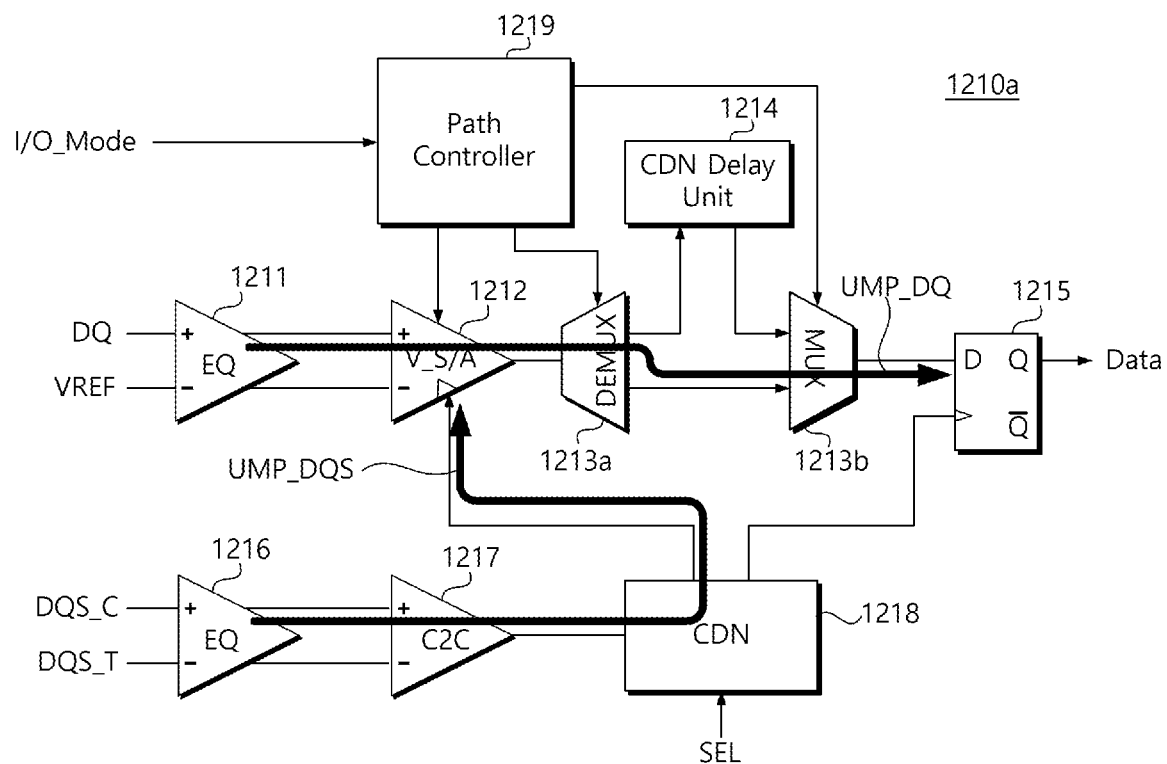
FIG. 5 is a diagram showing paths of a data signal DQ and a data strobe signal DQS in an unmatched mode of the compatible input/output circuit according to the present invention.

FIG. 5 is a diagram showing paths of a data signal DQ and a data strobe signal DQS in an unmatched mode of the compatible input/output circuit according to the present invention. Referring to FIG. 5, in the unmatched mode, the data signal DQ may be transferred to the flip-flop 1215 using the shortest path UMP_DQ that bypasses the CDN delay unit 1214. Alignment with the data strobe signal DQS may be performed through training of the data signal DQ or the data strobe signal DQS that is performed later. And in the unmatched mode, the data strobe signal DQS may also be transmitted to the variable sampler 1212 via the shortest delay path UMP_DQS including the clock distribution network 1218.

The input/output mode I/O_Mode may be provided from the memory controller 1100 in an unmatched mode. The input/output mode I/O_Mode may be provided from the memory controller 1100 through a command or a control signal. The input/output mode I/O_Mode may be provided by using a Universal Internal Bus UIB command or by using a special command transmitted by the memory controller 1100, for example, a get feature command or set feature command. In the unmatched mode, the path controller 1219 may set the variable sampler 1212 in the sampler mode, the demultiplexer 1213*a* and the multiplexer 1213*b* in the bypass mode, and the clock distribution network 1218 in the shortest distance mode.

In the unmatched mode, the data signal DQ transmitted from the memory controller 1100 may be filtered by the equalizer 1211. In addition, the variable sampler 1212 may operate in a sampler mode for sampling the data signal DQ. At this time, the data strobe signal DQS used for sampling by the variable sampler 1212 may be transferred to the shortest path of the clock distribution network 1218 or the bypassed data strobe path UMP_DQS.

The data signal DQ sampled by the variable sampler 1212 may be directly transferred to the flip-flop 1215 without passing through the CDN delay unit 1214 by the demultiplexer 1213*a* and the multiplexer 1213*b* controlled by the path controller 1219. The path selection operation by the variable sampler 1212, the demultiplexer 1213*a*, and the multiplexer 1213*b* may be controlled by the path controller 1219.

In the unmatched mode, the data strobe signal DQS transmitted to the equalizer 1216 may be transmitted to the variable sampler 1212 along the data strobe path UMP_DQS. In the unmatched mode, the data strobe signal DQS filtered by the equalizer 1216 may be amplified by the C2C converter 1217. The amplified data strobe signal DQS may be passed to a clock distribution network 1218. At this time, the delay size of the clock distribution network 1218 may be arbitrarily selected. Preferably, the data strobe signal DQS may be passed through the shortest delay path of the clock distribution network 1218 to the variable sampler 1212. Then, the variable sampler 1212 operating in the sampler mode may sample the data signal DQ using the data strobe signal DQS transmitted through the data strobe path UMP_DQS. Thereafter, alignment of the data signal DQ and the data strobe signal DQS may be achieved through subsequent training operation.

The paths of the data signal DQ and the data strobe signal DQS may be selected according to the path selection operation in the unmatched mode of the compatible input/output circuit 1210*a* described above. The data signal DQ and the data strobe signal DQS may be aligned through training operation performed thereafter. Through the path setting in the unmatched mode, the compatible input/output circuit 1210*a* may be reconfigured into a structure suitable for high-speed data reception.

Figure 6:
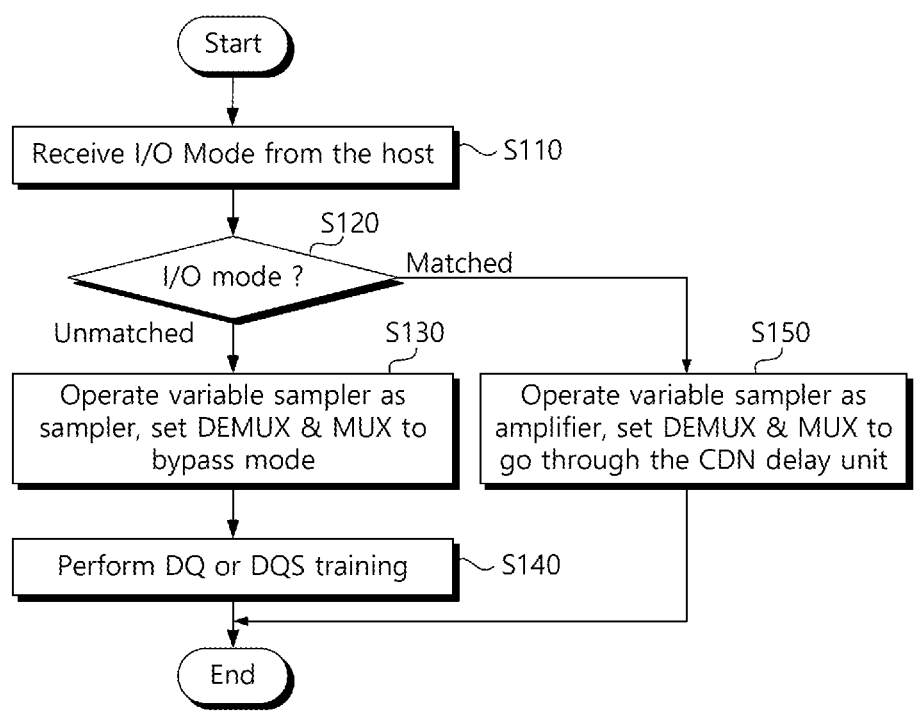
FIG. 6 is a flowchart schematically illustrating a path selection operation of a compatible input/output circuit of a nonvolatile memory device according to an embodiment of the present invention.

FIG. 6 is a flowchart schematically illustrating a path selection operation of a compatible input/output circuit of a nonvolatile memory device according to an embodiment of the present invention. Referring to FIG. 6, according to the input/output mode, the operation modes of the variable sampler 1212 (refer to FIG. 3), the demultiplexer 1213*a* (refer to FIG. 3), and the multiplexer 1213*b* (refer to FIG. 3), and the path set of clock distribution network 1218 (refer to FIG. 3) may all be set.

In step S110, the compatible input/output circuit 1210*a* (refer to FIG. 3) of the nonvolatile memory device 1200 may receive the input/output mode I/O_Mode from the memory controller 1100 or the host. For example, the memory controller 1100 may provide the input/output mode I/O_Mode to the nonvolatile memory device 1200 using at least one of a control signal, a universal internal bus UIB command, a get feature, or a set feature command.

In step S120, the compatible input/output circuit 1210 may perform an operation branch according to the received input/output mode I/O_Mode. For example, the compatible input/output circuit 1210*a* may determine whether the received input/output mode I/O_Mode is the unmatched mode or the matched mode. If the received input/output mode I/O_Mode corresponds to the unmatched mode, the procedure may move to step S130. On the other hand, if the received input/output mode I/O_Mode corresponds to the matched mode, the procedure may move to step S150.

In step S130, the path controller 1219 may set the variable sampler 1212 to the sampler mode for sampling the data signal DQ in order to set the unmatched mode. If the default operation mode of the variable sampler 1212 is set to the sampler mode, the path controller 1219 may maintain the sampler mode, which may be the default operation mode, as the operation mode of the variable sampler 1212. Then, the path controller 1219 may set the paths of the demultiplexer 1213*a* and the multiplexer 1213*b* to the bypass mode that does not pass through the CDN delay unit 1214. In addition, the path controller 1219 may provide the data strobe signal DQS of the clock distribution network 1218 to the variable sampler 1212 through the selection signal SEL. Then, the paths of the data signal DQ and the data strobe signal DQS may be set to the data path UMP_DQ and the data strobe path UMP_DQS of FIG. 5, respectively.

In step S140, training of the data signal DQ or the data strobe signal DQS in the unmatched mode of the compatible input/output circuit 1210*a* may be performed. For training, a procedure in which a training pattern is written and read by the memory controller 1100 may be performed. And it may be fixed to the delay value of the data signal DQ or the data strobe signal DQS providing optimum reliability.

In step S150, the path controller 1219 may set the variable sampler 1212 to the amplifier mode to set the matched mode. If the default operation mode of the variable sampler 1212 is set to the sampler mode, the path controller 1219 may switch the operation mode of the variable sampler 1212 to the amplifier mode. The path controller 1219 may set the demultiplexer 1213a and the multiplexer 1213b so that the data signal DQ passes through the CDN delay unit 1214. In addition, the path controller 1219 may transfer the data strobe signal DQS of the clock distribution network 1218 to the flip-flop 1215 through the selection signal SEL. Then, the paths of the data signal DQ and the data strobe signal DQS may be set to the data path MP_DQ and the data strobe path MP_DQS of FIG. 4, respectively.

As described above, the compatible input/output circuit 1210a may change the paths of the data signal DQ and the data strobe signal DQS according to the input/output mode I/O_Mode. In the unmatched mode optimized for high-speed data reception, the data signal DQ and the data strobe signal DQS may be aligned through subsequent training operation. On the other hand, in the matched mode, the data signal DQ and the data strobe signal DQS may be aligned with a predetermined optimal delay value, which may be advantageous for relatively low-speed data reception. Due to the characteristics of the compatible input/output circuit 1210a, the nonvolatile memory device 1200 may provide compatibility regardless of generation of the memory device.

Figure 7:
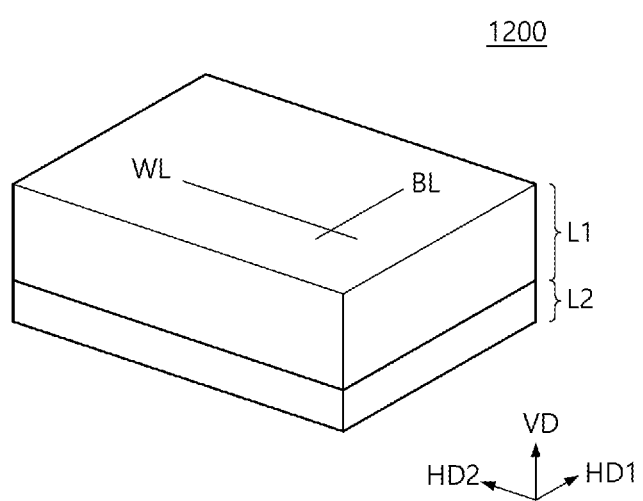
FIG. 7 schematically shows an exemplary structure of the nonvolatile memory device of FIG. 2.

FIG. 7 schematically shows an exemplary structure of the nonvolatile memory device of FIG. 2. Referring to FIG. 2 and FIG. 7, the nonvolatile memory device 1200 (refer to FIG. 2) may include a first semiconductor layer L1 and a second semiconductor layer L2, and the first semiconductor layer L1 may be stacked in a direction VD perpendicular to the second semiconductor layer L2 (e.g., perpendicular to a top surface of the second semiconductor layer L2). Specifically, the second semiconductor layer L2 may be disposed below in the vertical direction VD with respect to the first semiconductor layer L1, and accordingly, the second semiconductor layer L2 may be disposed closer to the substrate.

In an embodiment, the cell array 1260 of FIG. 2 may be formed on the first semiconductor layer L1, and a peripheral circuit including the control circuit 1220, the address decoder 1240, and the page buffer circuit 1280, and/or the compatible input/output circuit 1210 may be formed in the second semiconductor layer L2. Accordingly, the nonvolatile memory device 1200 may have a structure in which the cell array 1260 is disposed on the peripheral circuits 1210, 1220, 1240, and 1280, that is, a cell over peripheral COP structure. The COP structure may effectively reduce a horizontal area and improve the degree of integration of the nonvolatile memory device 1200.

In an embodiment, the second semiconductor layer L2 may include a substrate. The peripheral circuits 1210, 1220, 1240, 1280 may be formed in the second semiconductor layer L2 by forming transistors and metal patterns for wiring the transistors on the substrate. After the peripheral circuits 1210, 1220, 1240, and 1280 are formed in the second semiconductor layer L2, the first semiconductor layer L1 including the cell array 1260 may be formed. And then metal patterns for electrically connecting the word lines WL and bit lines BL and the peripheral circuits 1210, 1220, 1240, and 1280 formed in the second semiconductor layer L2 may be formed. For example, the bit lines BL may extend in the first horizontal direction HD1, and the word lines WL may extend in the second horizontal direction HD2.

As the semiconductor process develops, and as the number of stages of memory cells disposed in the cell array 1260 increases, that is, as the number of stacked word lines increases, the area of the cell array 1260 may decrease. Accordingly, the area of the peripheral circuits 1210, 1220, 1240, and 1280 may also be reduced. In particular, the nonvolatile memory device 1200 according to the present invention may include a compatible input/output circuit 1210 having a minimized additional configuration. Accordingly, the nonvolatile memory device 1200 of the present invention may provide high compatibility regardless of memory generation without additional area increase.

Figure 8:
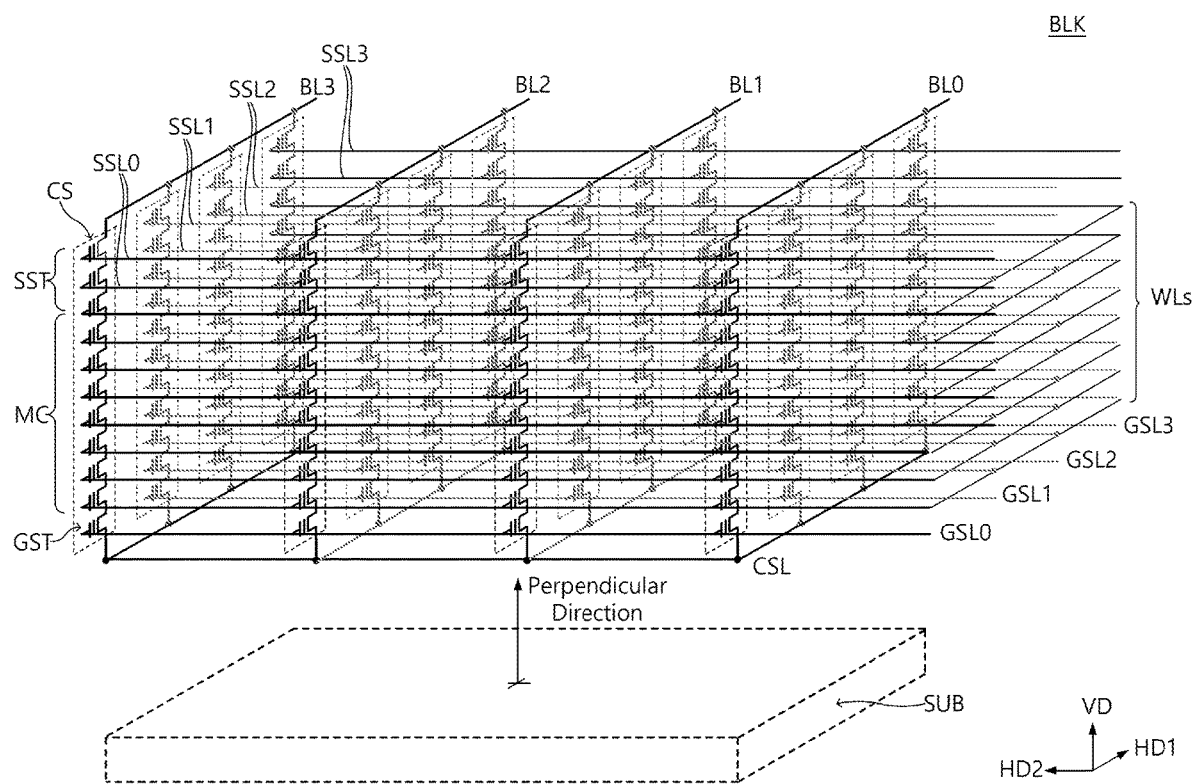
FIG. 8 is a circuit diagram illustrating an exemplary structure of a memory block constituting the cell array of FIG. 2.

FIG. 8 is a circuit diagram illustrating an exemplary structure of a memory block constituting the cell array of FIG. 2. Referring to FIG. 8, cell strings CS may be formed between the bit lines BL0, BL1, BL2, and BL3 and the common source line CSL to form the memory block BLK.

Cell strings CS may be formed between the bit line BL0 and the common source line CSL. A plurality of cell strings CS may also be formed between the bit lines BL1, BL2, and BL3 and the common source line CSL in the same manner. The string select transistor SST of the cell strings CS may be connected to the corresponding bit line BL. The ground select transistor GST of the cell strings CS may be connected to the common source line CSL. Memory cells MC may be provided between the string select transistor SST and the ground select transistor GST of the cell string CS.

Each of the cell strings CS may include a ground select transistor GST. Ground selection transistors GST included in the cell strings CS may be controlled by the ground selection line GSL (e.g., GSL0, GSL1, GSL2, GSL3). Alternatively, although not shown, cell strings corresponding to each row may be controlled by different ground selection lines.

A circuit structure of memory cells included in one memory block BLK has been briefly described above. However, the circuit structure of the illustrated memory block BLK is only a simplified structure for convenience of description, and the actual memory block is not limited to the illustrated example. That is, it will be well understood that more semiconductor layers, bit lines BLs, and string select lines SSLs may be included in one physical block.

Figure 9:
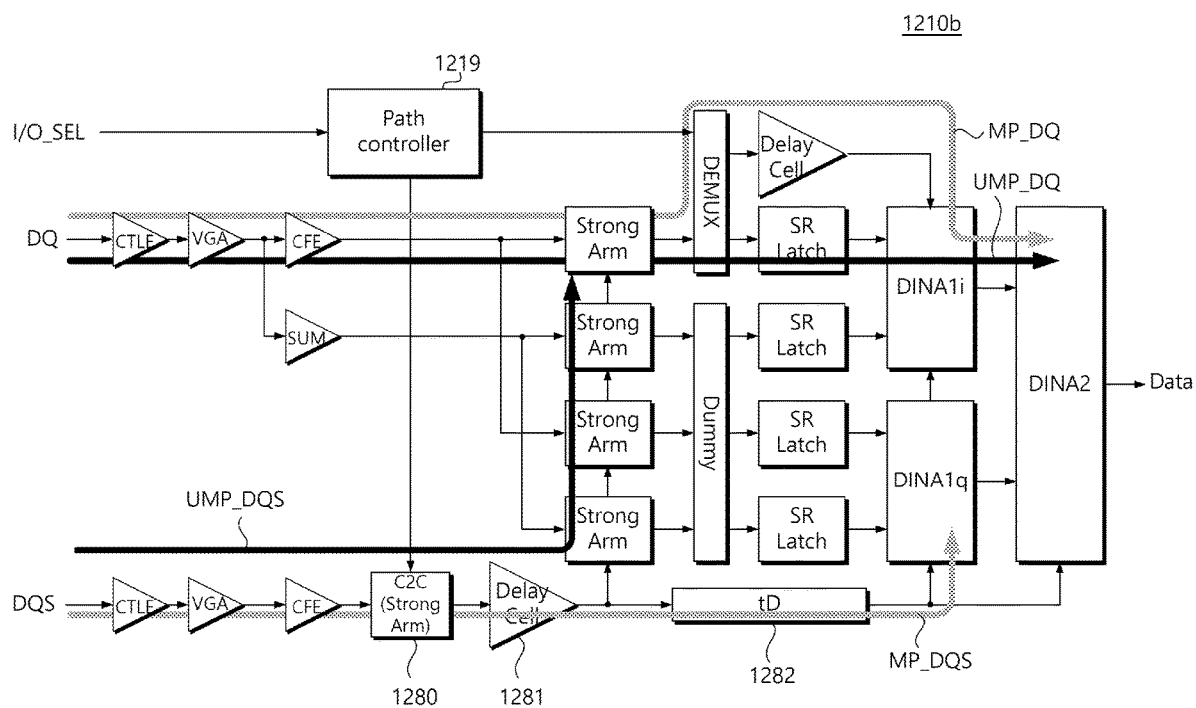
FIG. 9 is a block diagram illustrating a compatible input/output circuit according to another embodiment of the present invention.

FIG. 9 is a block diagram illustrating a compatible input/output circuit according to another embodiment of the present invention. Referring to FIG. 9, the compatible input/output circuit 1210b according to another embodiment may use a 4-phase reception method capable of high-speed transmission of a data signal DQ.

The compatible input/output circuit 1210b according to another embodiment may use a continuous-time linear equalizer CTLE, a variable gain amplifier VGA, and a complete feedback equalizer CFE to obtain a data signal DQ and a data strobe signal DQS. The Strong Arm samplers may sample or amplify the filtered data signal DQ by each data strobe signal DQS delayed in a 4-phase.

When the input/output mode I/O_Mode corresponds to the unmatched mode, the demultiplexer DEMUX may transfer the data signal DQ sampled by the Strong Arm samplers to the SR latches. In this case, a dummy delay unit Dummy may be inserted before the SR latches to match the delays of the data signals DQ of three phases that do not pass through the demultiplexer DEMUX. Outputs of the SR latches may be transmitted to the latch circuits DINA1i, DINA1q, and DINA2 to constitute input data Data. In the unmatched mode, the data signal DQ may be transmitted along the data path UMP_DQ, and the data strobe signal DQS may be transmitted through the data strobe path UMP_DQS.

When the input/output mode I/O_Mode corresponds to the matched mode, the demultiplexer DEMUX may transmit the data signal DQ sampled by the Strong Arm samplers to the latch circuits DINA1i, DINA1q, DINA2 via the Delay cell. At this time, the data strobe signal DQS may pass through the continuous time linear equalizer CTLE, the variable gain amplifier VGA, and the complete feedback equalizer CFE. In addition, in the matched mode, the C2C converter 1280 may be activated, and the data strobe signal DQS amplified in the C2C converter 1280 may pass through the delay cell 1281 and the delay circuit 1282 to the latch circuits DINA1*i*, DINA1*q*, DINA2. In the matched mode, the data signal DQ may be transmitted along the data path MP_DQ, and the data strobe signal DQS may be transmitted through the data strobe path MP_DQS.

Figure 10:
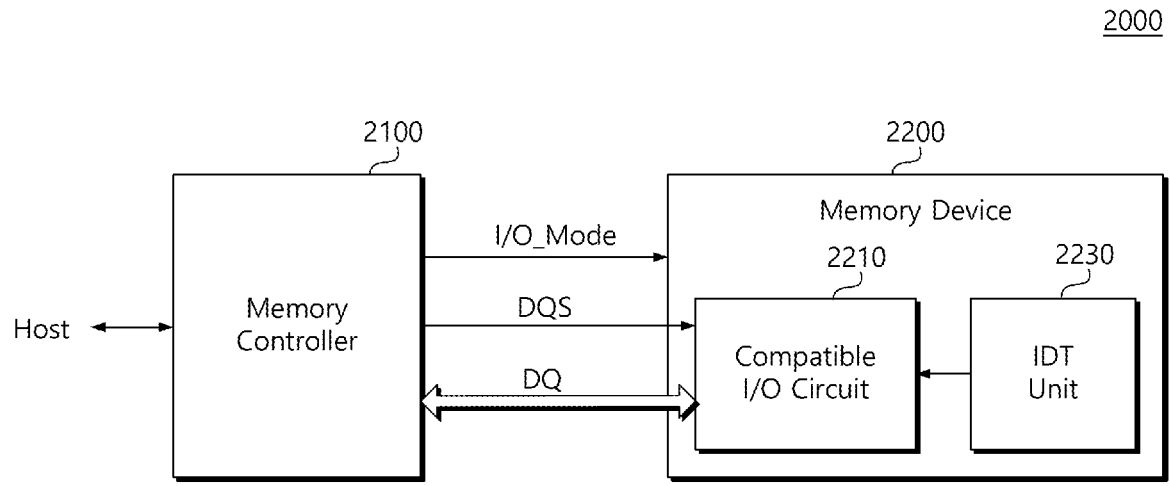
FIG. 10 is a block diagram illustrating a storage device according to another exemplary embodiment.

FIG. 10 is a block diagram illustrating a storage device according to another exemplary embodiment. Referring to FIG. 10, the storage device 2000 of the present invention may include a memory controller 2100 and a nonvolatile memory device 2200. For example, each of the memory controller 2100 and the nonvolatile memory device 2200 may be provided as one chip, one package, or one module. Alternatively, the memory controller 2100 and the nonvolatile memory device 2200 may be formed as one chip, one package, or one module, and may be provided as storage such as an embedded memory, a memory card, a memory stick, and a solid state drive SSD.

The memory controller 2100 may perform an access operation for writing data to the nonvolatile memory device 2200 or reading data stored in the nonvolatile memory device 2200. The memory controller 2100 may generate a command CMD and an address ADD for accessing the nonvolatile memory device 2200. In particular, the memory controller 2100 may provide a data signal DQ and a data strobe signal DQS to transmit data, an address, and/or a command. The data signal DQ and the data strobe signal DQS may need to be precisely matched to ensure data reliability.

The memory controller 2100 may provide an input/output mode I/O_Mode for selecting a reception method of the data signal DQ and the data strobe signal DQS of the nonvolatile memory device 2200. A reception method of the data signal DQ and the data strobe signal DQS of the nonvolatile memory device 2200 may be selected by providing the input/output mode I/O_Mode.

If the transmission method of the data signal DQ and the data strobe signal DQS corresponds to the conventional matched type, the compatible input/output circuit 2210 of the nonvolatile memory device 2200 may be set to the matched type. In this case, the memory controller 2100 may set the compatible input/output circuit 2210 of the nonvolatile memory device 2200 to a matched type through the input/output mode I/O_Mode. On the other hand, when the transmission method of the data signal DQ and the data strobe signal DQS corresponds to the unmatched type for high-speed operation, the compatible input/output circuit 2210 of the nonvolatile memory device 2200 may be set to an unmatched type that aligns the data signal DQ and the data strobe signal DQS through training operation. In this case, the memory controller 2100 may set the compatible input/output circuit 2210 of the nonvolatile memory device 2200 to an unmatched type through the input/output mode I/O_Mode.

The nonvolatile memory device 2200 may output read data requested by the memory controller 2100 to the memory controller 2100 or store data requested to be written by the memory controller 2100 in a memory cell. In particular, the nonvolatile memory device 2200 of the present invention may include a compatible input/output circuit 2210 and an internal DQS training unit 2230. The compatible input/output circuit 2210 may set the alignment method of the data signal DQ and the data strobe signal DQS to a matched type or an unmatched type according to the input/output mode I/O_Mode. For this purpose, the compatible input/output circuit 2210 may change the paths of the data signal DQ and the data strobe signal DQS into a matched type or an unmatched type.

Here, when the input/output mode I/O_Mode of the compatible input/output circuit 2210 is set to the unmatched mode, the internal DQS training unit 2230 may perform its own DQS training. To this end, the internal DQS training unit 2230 may include an internal oscillator.

As described above, according to the configuration and function of the compatible input/output circuit 2210, the nonvolatile memory device 2200 of the present invention may have compatibility with respect to each of the matched interface and the unmatched interface. That is, an arrangement method of the data signal DQ and the data strobe signal DQS may be selected according to the interface type of the memory controller 2100. Through this, it may be freely mounted on an unmatched controller or an existing matched controller that requires high-speed data transmission.

Figure 11:
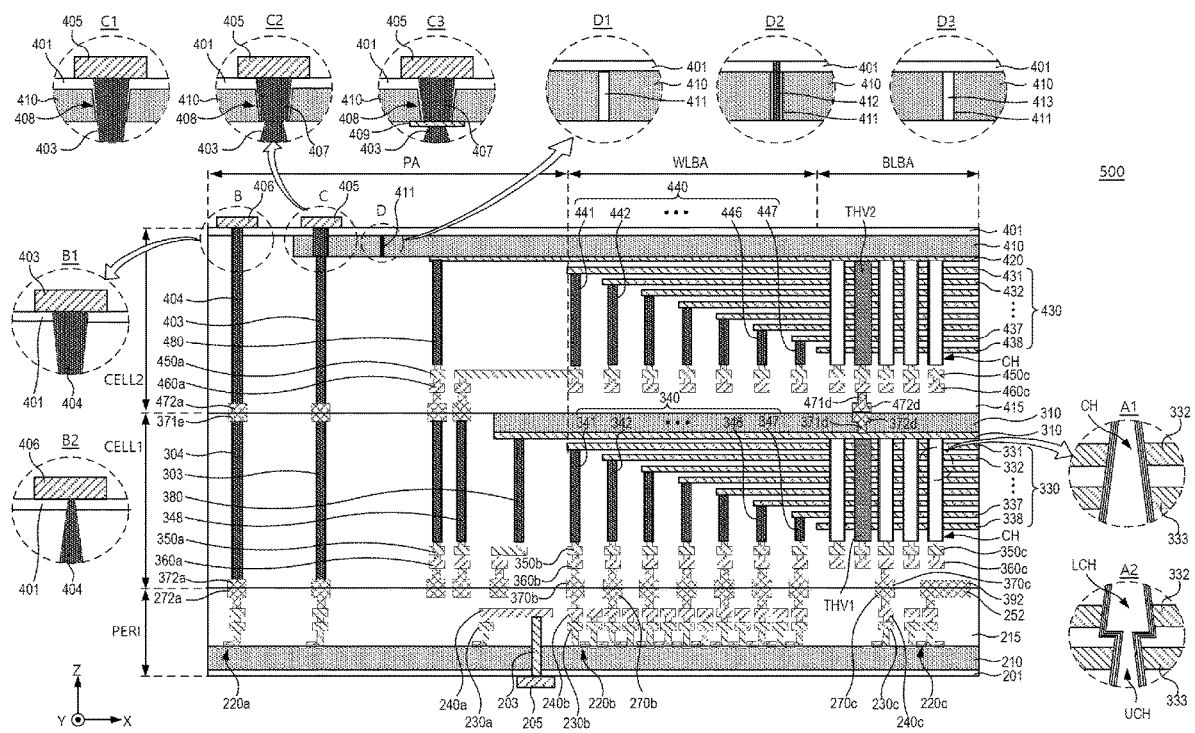
FIG. 11 is a diagram for describing a memory device according to an embodiment of the present invention.

FIG. 11 is a view illustrating a memory device 500 according to some embodiments of the inventive concepts.

Referring to FIG. 11, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 11, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 11. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of the inventive concepts are not limited thereto. In certain embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device 500.

Meanwhile, the number of the lower word lines 331 and 332 penetrated by the lower channel LCH is less than the number of the upper word lines 333 to 338 penetrated by the upper channel UCH in the region 'A2'. However, embodiments of the inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 11, the first through-electrode THV1 may penetrate the common source line 320 and the plurality of word lines 330. In certain embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer, and the bit line 360c may be electrically connected to the circuit elements 220c constituting the page buffer through an upper bonding metal pattern 370c of the first cell region CELL1 and an upper bonding metal pattern 270c of the peripheral circuit region PERI.

Referring continuously to FIG. 11, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may constitute the row decoder, and the cell contact plugs 340 may be electrically connected to the circuit elements 220b constituting the row decoder through the upper bonding metal patterns 370b of the first cell region CELL1 and the upper bonding metal patterns 270b of the peripheral circuit region PERI. In some embodiments, an operating voltage of the circuit elements 220b constituting the row decoder may be different from an operating voltage of the circuit elements 220c constituting the page buffer. For example, the operating voltage of the circuit elements 220c constituting the page buffer may be greater than the operating voltage of the circuit elements 220b constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b of the first cell region CELL1 and the upper bonding metal patterns 270b of the peripheral circuit region PERI may be formed of aluminum, copper, or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405 and 406 may be disposed in the external pad bonding region PA. Referring to FIG. 11, a lower insulating layer 201 may cover a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface (in a +Z-axis direction) of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 (e.g., an X-axis direction) and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater (e.g., increase) toward the upper insulating layer 401. In other words, a diameter of the channel structure CH described in the region 'A1' may become progressively less (e.g., decrease) toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH described in the region 'A1', the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside (e.g., external to the memory device 500). In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

The above are specific embodiments for carrying out the present invention. In addition to the above-described embodiments, the present invention may include simple design changes or easily changeable embodiments. In addition, the present invention will include techniques that can be easily modified and implemented using the embodiments. Therefore, the scope of the present invention should not be limited to the above-described embodiments, and should be defined by the claims and equivalents of the claims of the present invention as well as the claims to be described later.

What is claimed is:

1. A nonvolatile memory device configured to receive a data signal and a data strobe signal from an external source, comprising:
   a variable sampler configured to process the data signal in an amplifier mode or a sampler mode in response to a control signal;
   a selection circuit configured to transmit the data signal output from the variable sampler to a flip-flop via a delay unit or to the flip-flop via a path that bypasses the delay unit in response to the control signal;
   a converter configured to amplify the data strobe signal;
   a clock distribution network configured to transmit the data strobe signal amplified by the converter to the variable sampler or delay the amplified data strobe signal for a predetermined time and transmit the amplified data strobe signal to the flip-flop in response to the control signal; and
   a path controller configured to generate the control signal according to an input/output mode.

2. The device of claim 1, wherein the path controller is configured to generate the control signal that corresponds to the variable sampler operating in the amplifier mode and the selection circuit transmitting the data signal to the flip-flop via the delay unit when the input/output mode is a matched mode.

3. The device of claim 2, wherein the path controller is configured to generate the control signal that corresponds to the clock distribution network transmitting the amplified data strobe signal to the flip-flop when the input/output mode is the matched mode.

4. The device of claim 3, wherein the delay unit is configured to delay the data signal based on the predetermined time the amplified data strobe signal is configured to be delayed by the clock distribution network.

5. The device of claim 1, wherein the path controller is configured to generate the control signal that corresponds to the variable sampler operating in the sampler mode and the selection circuit transmitting the data signal via the path that bypasses the delay unit when the input/output mode is an unmatched mode.

6. The device of claim 5, wherein the path controller is configured to generate the control signal that corresponds to the clock distribution network transmitting the amplified data strobe signal to the variable sampler when the input/output mode is the unmatched mode.

7. The device of claim 1, wherein the selection circuit comprises:
   a demultiplexer configured to output the data signal to the delay unit or to the path that bypasses the delay unit in response to the control signal; and
   a multiplexer configured to select one of the delay unit and the path that bypasses the delay unit in response to the control signal and configured to transmit the data signal received from the selected one to the flip-flop.

8. The device of claim 1, wherein the variable sampler includes either a double tail latch or a strong arm latch.

9. The device of claim 1, further comprising:
   a first equalizer configured to remove an inter-symbol interference of the data signal and transmit the data signal to the variable sampler; and
   a second equalizer configured to remove an inter-symbol interference of the data strobe signal and transmit the data strobe signal to the converter.

10. A nonvolatile memory device, comprising:
    a compatible input/output circuit configured to align a delay of a data signal and a data strobe signal by setting a path of the data signal and a path of the data strobe signal to either a matched mode or an unmatched mode according to an input/output mode such that a sampled data signal is output from the compatible input/output circuit; and
    a memory core including memory cells configured to store the sampled data signal output from the compatible input/output circuit,
    wherein, in the unmatched mode, the data signal and the data strobe signal are aligned through a training operation, and
    wherein the compatible input/output circuit comprises:
    a path controller configured to generate a control signal for setting the path of the data signal and the path of the data strobe signal to the matched mode or the unmatched mode according to the input/output mode;

a variable sampler configured to process the data signal in an amplifier mode or a sampler mode in response to the control signal; and a selection circuit configured to transmit the data signal output from the variable sampler to a flip-flop via a delay unit or to the flip-flop via a path that bypasses the delay unit in response to the control signal.

11. The device of claim 10, wherein the compatible input/output circuit further comprises:

a converter configured to amplify the data strobe signal; and a clock distribution network configured to transmit the data strobe signal amplified by the converter to the variable sampler in response to the control signal or to the flip-flop with a predetermined time delay in response to the control signal.

12. The device of claim 11, wherein the variable sampler is configured to operate in the amplifier mode in the matched mode and in the sampler mode in the unmatched mode in response to the control signal.

13. The device of claim 12, wherein the variable sampler is configured to be synchronized with the converter in the matched mode.

14. The device of claim 11, wherein the delay unit is configured to delay the data signal according to a delay amount of the predetermined time delay occurring in the clock distribution network in the matched mode.

15. The device of claim 11, further comprising:

a first equalizer configured to remove an inter-symbol interference of the data signal and transmit the data signal to the variable sampler; and a second equalizer configured to remove an inter-symbol interference of the data strobe signal and transmit the data strobe signal to the converter.

16. The device of claim 15, wherein the first equalizer or the second equalizer includes a decision feedback equalizer.

17. The device of claim 10, wherein the compatible input/output circuit is configured to perform the training operation after being set to the unmatched mode, and wherein the training operation includes training of the data signal or training of the data strobe signal.

18. The device of claim 10, further comprising:

an internal training unit configured to perform the training operation, the training operation including training of the data signal or training of the data strobe signal.

19. The device of claim 18, wherein the internal training unit includes an oscillator configured to generate a clock signal for the training operation.

20. A method of setting compatibility of a nonvolatile memory device, comprising:

receiving an input/output mode of a data signal and a data strobe signal from a source external to the nonvolatile memory device;

setting paths of the data signal and the data strobe signal in an input/output circuit of the nonvolatile memory device to a matched type or an unmatched type according to the received input/output mode; and performing a training operation to align the data signal and the data strobe signal when the input/output circuit is set to the unmatched type, wherein the input/output circuit comprises:

a variable sampler that samples the data signal based on the data strobe signal when the input/output circuit is set to the unmatched type; and a selection circuit that transmits the data signal output from the variable sampler to a flip-flop via a path that bypasses a delay unit when the input/output circuit is set to the unmatched type.

* * * * *